United States Patent [19]
Chambers, Jr. et al.

[11] 4,429,027
[45] Jan. 31, 1984

[54] PHOTOIMAGING PROCESS

[75] Inventors: Vaughan C. Chambers, Jr., Wilmington, Del.; Joseph E. Gervay, Red Bank, N.J.

[73] Assignee: E. I. Du Pont de Nemours & Co., Wilmington, Del.

[21] Appl. No.: 266,057

[22] Filed: May 21, 1981

[51] Int. Cl.³ ............................................. G03C 11/12
[52] U.S. Cl. ...................................... 430/5; 430/126; 430/396; 430/39
[58] Field of Search .................... 430/5, 396, 126, 39

[56] References Cited

U.S. PATENT DOCUMENTS 2,956,875  10/1960  Ulary ................................. 430/5 X
3,576,624  4/1971  Matkan ............................... 430/5 X

*Primary Examiner*—John D. Welsh

[57] ABSTRACT

A simplified method for photoimaging a photosensitive layer produces in situ a radiation-opaque photomask on the photosensitive layer or on a cover sheet of the layer. A nonvisible latent image is toned and the toner is transferred to a layer or cover sheet to form an actinic radiation-opaque photomask.

5 Claims, 24 Drawing Figures

PHOTOIMAGING PROCESS

BACKGROUND OF THE INVENTION

1. Field of the Invention

This invention relates to photosensitive imaging and, more particularly, to producing a radiation-opaque photomask on a photosensitive surface or cover sheet.

2. Description of the Prior Art

It is well known to use a variety of preimaged layers as photomasks for imaging photosensitive elements. Diazo, electrographic, silver halide, and photopolymer films have all been useful for the production of such photomasks. These prior art methods all employ a photosensitive film which is coated or laminated onto a support. After appropriate exposure and processing the photosensitive layer produces density areas comprised of toner, dye, silver, photopolymer, etc. When the photomask layer is placed over a photosensitive element and irradiated, the density areas block or modulate the radiation and thus control the exposure within the photosensitive layer of the photosensitive element.

Both halftone and continuous tone imaging may employ such photomask films or layers. U.S. Pat. No. 3,060,026 teaches that a cover sheet useful for photopolymer films may contain useful information such as graphs or other detail and in this fashion also serve as a photomask layer. U.S. Pat. No. 3,755,892 teaches that a silk-screened image or a developed photosensitive layer may be adhered to the protective layer over a photosensitive resist. U.S. Pat. No. 3,740,225 teaches the use of punched tape as a photomask for imaging a photosensitive material.

Both electrostatic and magnetic toners have been described in useful applications for information transfer. U.S. Pat. No. 2,956,875 discloses toning an electrostatic latent image and transferring the dry powder image to a premoistened gelatine surface to produce a silk screen. U.S. Pat. No. 3,740,205 discloses that magnetic information on a magnetic tape may be toned by a fluid magnetic toner which can then be transferred and fixed upon a surface. U.S. Pat. No. 3,804,511 and U.S. Pat. No. 3,993,484 teach that magnetic toner in correspondence with an electrostatic image may be used to produce surface images by transfer to a copy medium such as paper, to produce multiple or color images. U.S. Pat. No. 4,135,195 discloses magnetic toning which includes a heat transfer step. British patent applications Nos. 2000728 and 2000729 disclose a method of transferring powder magnetic toner via an intermediate magnetized drum to increase resolution of the final image. U.S. Pat. No. 4,117,498 teaches a means for producing colored toner particles suitable for printing on fabric.

A wealth of techniques, devices, and processes are available by which information may be transferred. In the case where it is desired to provide a photomask for the purpose of photoimaging a photosensitive substrate it is necessary to interpose a layer or film between the exposing radiation and the photosensitive substrate. Thus in view of the difficulties attendant with the every increasing demands of productivity it would be advantageous if this process could be simplified so that no layer or film were required.

SUMMARY OF THE INVENTION

The invention is a process for photoimaging a photosensitive layer by which a photomask is created in situ, thereby eliminating the requirement for a separate photomask. The in situ photomask may be created directly on the surface or indirectly by transfer to the surface. The process is adaptable for electronic information systems.

The invention is directed to a process for photoimaging a photosensitive layer comprising the steps:

(a) transferring an actinic radiation-opaque image onto the layer or onto a transparent cover sheet thereon;
(b) exposing the image-bearing layer to actinic radiation by which the layer is photoimaged;
(c) removing the cover sheet if one is used; and
(d) developing or fixing the resultant photoimage.

The process by which the image is transferred onto the layer or cover sheet preferably comprises the steps:

(i) forming a latent image on a magnetic or electrostatic recording surface;
(ii) toning the recording surface with opaque toner to form a toner image; and
(iii) transferring the toned image to the photosensitive layer or cover sheet.

Within the scope of the present invention the image so transferred may optionally be removed either with a cover sheet, if one is used, or during fixing or development of the photosensitive stratum. Still other applications may require that the transferred image remain on the photoimage after fixing or development.

It is a particularly preferred application of the present invention that the photosensitive layer be laminated to a metal or polymeric substrate for the purpose of producing an end product such as a printing plate, printed circuit, solder mask, color print, transparency, etc.

The process of the present invention may be used to produce either positive or negative images.

A particular advantage of the present invention is that a visible photomask is produced from nonvisible stored information, thereby eliminating the contact and productivity problems which exist with conventional photomasks.

High resolution images are produced with exposed and processed photopolymer films upon the surface or cover sheet on which was applied an image opaque to the actinic radiation used for the exposure. Suitable ways by which the opaque image can be formed on the surface or cover sheet include mechanical, electromagnetic, or thermal imaging methods; these include techniques such as printing, magnetic toning, and laser writing. The opaque image may be formed on one surface and contact transferred to another surface or cover sheet. These high resolution images are capable of rapid and multiple reproduction.

While the use of a conventional photomask requires a vacuum contact exposure device to obtain high resolution; the present invention facilitates automation in that photomasking steps may be eliminated, simplified, or made more efficient. It is also important to note that images may be rapidly generated from digital or analog information, which is highly significant in situations where the entire automated process is to be under computer control and based on electronic information.

DETAILED DESCRIPTION OF THE INVENTION

The thrust of modern technology continues to stress electronic information gathering, transmittal, and display. Once it is available in either digital or analog modes, this electronic information may switch or modulate a variety of circuits or devices. In this way such electronic information may be used with magnetic systems, pulsed radiation, high speed printers, cathode ray tubes, microwave, etc. It is within the scope of the present invention to simplify the process by which this electronic information may be converted into a useful end product via photomask creation by either directly imaging a suitably prepared photosensitive element by means such as laser or microwave or by forming the photomask on a separate surface and transferring by contacting it to the photosensitive element or its cover sheet.

A wide range of transparent film supports are useful within the practice of the present invention, including glass, cellulose triacetate, polyethylene terephthalate, polystyrene, and polymerized acrylates. Films produced according to U.S. Pat. No. 2,779,684, U.S. Pat. No. 3,052,543, Canadian Pat. No. 562,672 and British Pat. No. 766,290 are particularly suitable because of their dimensional stability. In applications such as printing plates, solder masks, and printed circuits, the support may be opaque and contain metal or plastic. For other uses a paper or rubber composition may provide a suitable flexible support.

Suitable cover sheet materials include polyethylene terephthalate, regenerated cellulose, cellulose triacetate, polyethylene, polypropylene, polyamide, polyvinyl alcohol, and polyacrylate. One particular function of such cover sheets is to provide an oxygen barrier to protect an underlying photopolymer layer. The present invention is not, however, limited to producing a photomask on a transparent cover sheet to a photosensitive element.

The photosensitive layer which is imaged through the photomask either on the layer itself or on its cover sheet may be chosen from a wide variety of diazo, silver halide, photopolymer, or electrographic films. Both positive and negative working films are useful for practicing the present invention.

After being exposed through the photomask, these films may be processed in accordance with methods known in the art which include toning, heating, solvent washing, ammonia vapor treatment, dry peel apart, diffusion transfer, color coupling, and the conventional silver halide emulsion processing steps of developing, fixing, and washing. A particularly preferred method of practicing the present invention is to use a photopolymer film which has been laminated onto a substrate which will provide a final end product such as a color proof or transparency, solder mask, printed circuit, printing plate, etc.

DETAILED DESCRIPTION OF THE DRAWINGS

Figure 1A:
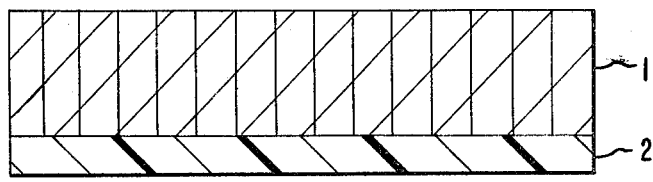
FIG. 1A represents an unmagnetized magnetic element.

FIG. 1A: The magnetic element consists of a magnetic layer 1 in which, in the absence of any applied magnetic field, there is no net magnetic attraction on the polymeric support 2.

Figure 1B:
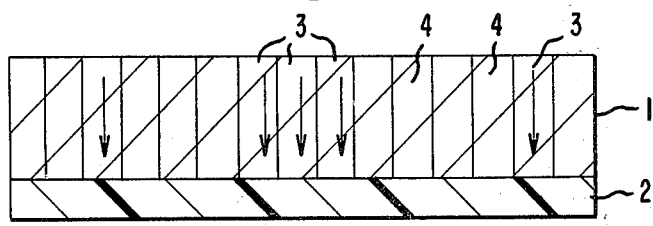
FIG. 1B represents a magnetized magnetic element.

FIG. 1B: When the element has been magnetized in a manner which corresponds to electronic information, the magnetic layer contains magnetized portions 3 and unmagnetized portions 4.

Figure 1C:
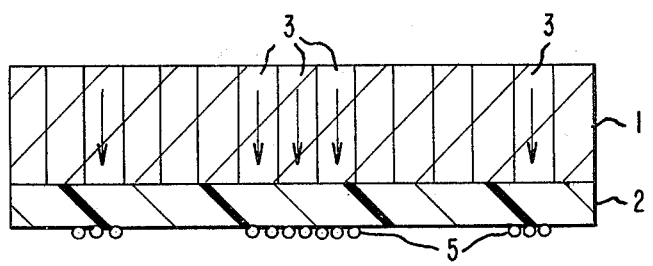
FIG. 1C represents the addition of magnetic toner particles.

FIG. 1C: Magnetic toner particles 5 when contacted with the support 2 are attracted to the magnetized portions 3.

Figure 1D:
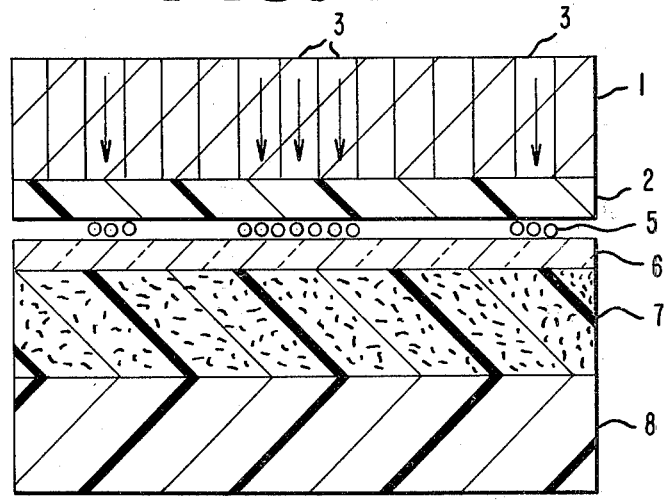
FIG. 1D represents contacting and transferring the magnetic toner to a photosensitive film.

FIG.1D: The magnetized and toned element is placed in contact with a photosensitive element such that the toner particles 5 are against the transparent cover sheet 6 attached to the photosensitive layer 7 adhering to the support 8.

Figure 1E:
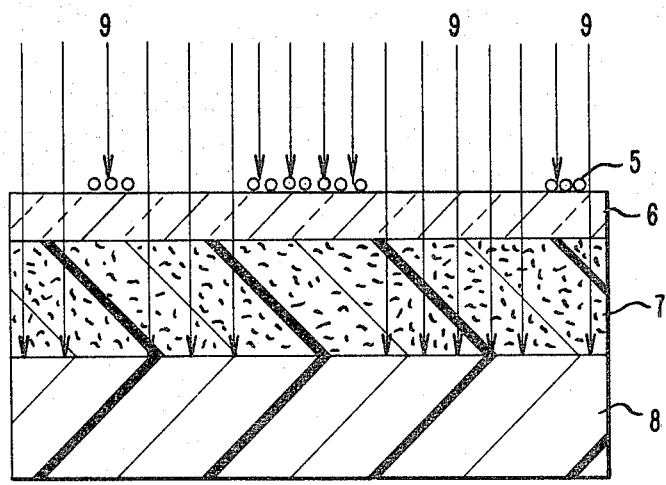
FIG. 1E represents exposing the film where the magnetic toner acts as a photomask.

FIG. 1E: Radiation 9 exposes the photosensitive element only in areas not blocked by the toner 5 which functions as a photomask.

Figure 1F:
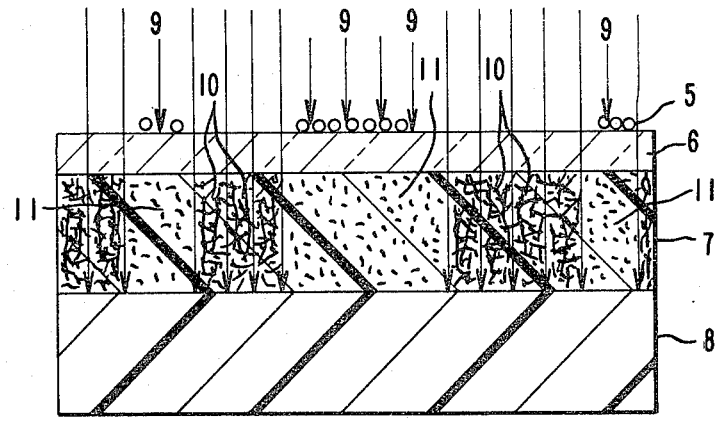
FIG. 1F represents the effect of continued exposure wereby the photosensitive element is reacted.

FIG. 1F: As the radiation 9 continues to expose areas 10 within the layer they react to produce a polymerized or crosslinked structure. In areas 11 the original structure is preserved.

Figure 1G:
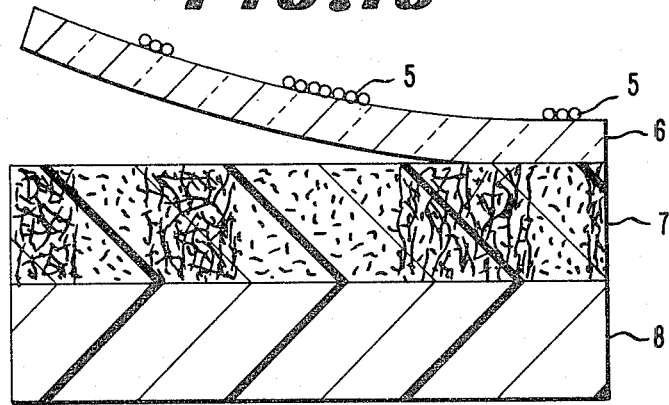
FIG. 1G represents removal of the cover sheet with its adherent photomask.

FIG. 1G: Cover sheet 6 with the toner photomask 5 is removed from the photosensitive layer 7.

Figure 1H:
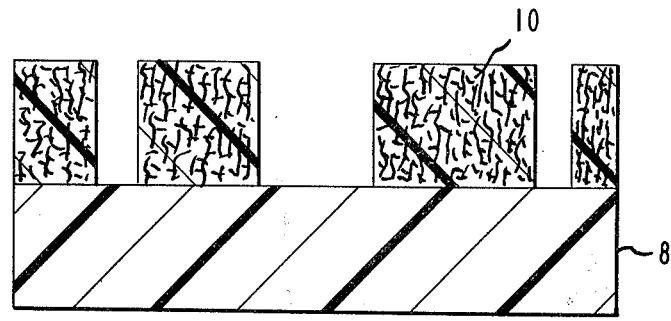
FIG. 1H represents a film processed to remove the unexposed portion.

FIG. 1H: By a suitable processing step, such as solvent washing, the unexposed areas are removed whereby only the exposed areas 10 remain on the support 8. The resultant image areas represent a transformation of the original electronic information to a final image without the use of a conventional photomask.

Figure 2A:
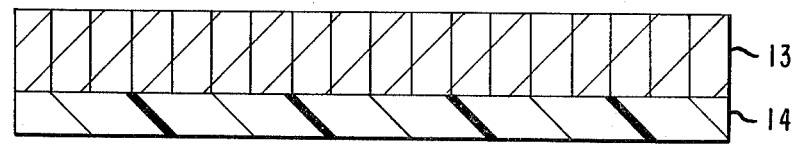
FIG. 2A represents a charge sensitive element.

FIG. 2A: The electrostatic imaging element consists of a layer 13 containing regions which can store charge and a support layer 14.

Figure 2B:
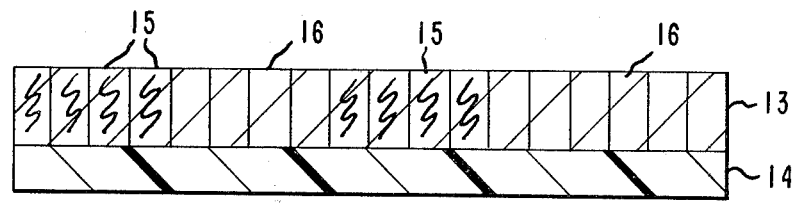
FIG. 2B represents charge acceptance by the element.

FIG. 2B: By receiving electronic information the element has charged regions 15 and uncharged regions 16.

Figure 2C:
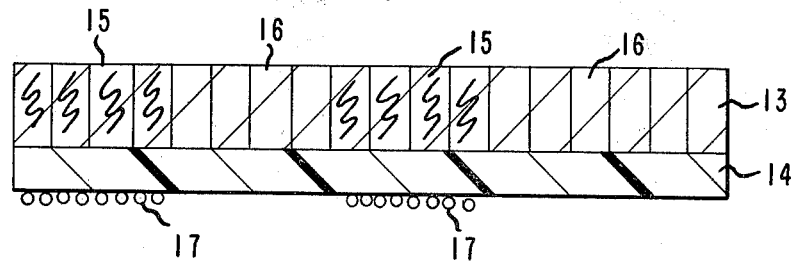
FIG. 2C represents toning of the element.

FIG. 2C: Electrostatic toner 17 is attracted to the support 14 in the charged areas 15.

Figure 2D:
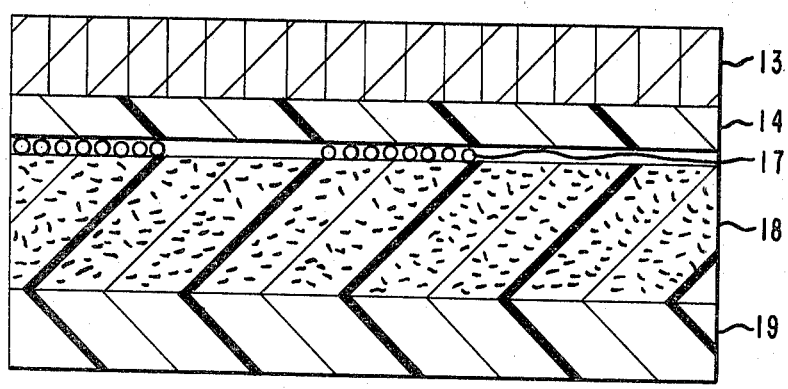
FIG. 2D represents contacting with a photosensitive element.

FIG. 2D: The element is contacted to a photosensitive element comprising a photosensitive layer 18 and a support 19 so that the toner 17 adheres to the surface.

Figure 2E:
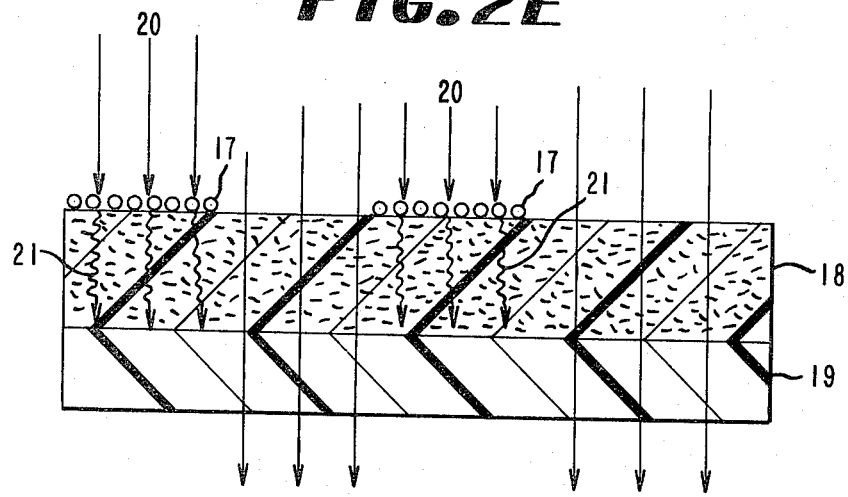
FIG. 2E represents exposure where the toned areas absorb and produce secondary radiation where otherwise the radiation passes through without effect.

FIG. 2E: The exposing radiation 20 is absorbed by the opaque toner 17 and a new radiation frequency 21 causes these areas of the photosensitive layer 18 to react, while the exposing radiation 20 otherwise passes through the element without effect.

Figure 2F:
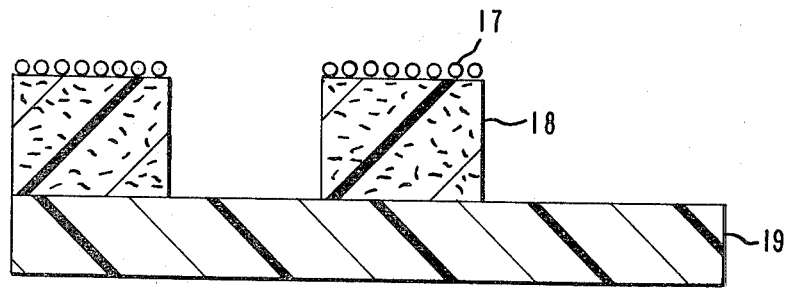
FIG. 2F represents processing to remove the unradiated portions.

FIG. 2F: By suitable washing or development imaged areas are produced which correspond to the original electrostatic image.

Figure 3A:
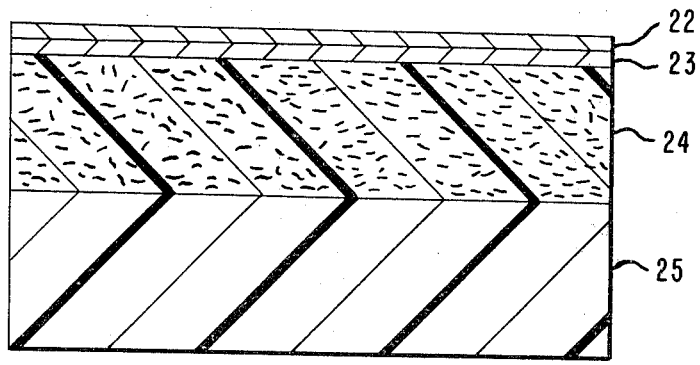
FIG. 3A represents an element with a thermal release layer.

FIG. 3A: A thermal developable element contains a support 25, a photosensitive layer 24, an opaque thermal release layer 23, and a thermal absorption cover sheet 22.

Figure 3B:
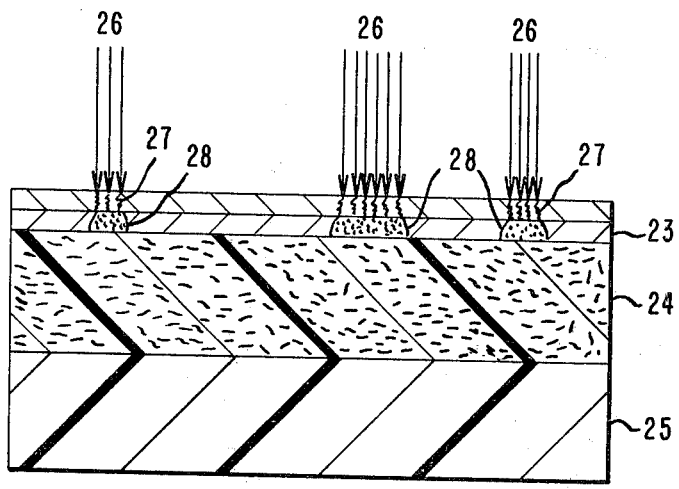
FIG. 3B represents irradiation promoting thermal release.

FIG. 3B: Thermal radiation 26 such as produced by a laser hits the thermal absorption cover sheet 22 and is transmitted through area 27 to produce areas 28 within the opaque thermal release layer 23. These areas 28 now adhere to the photosensitive layer 24 instead of the thermal absorption cover sheet 22.

Figure 3C:
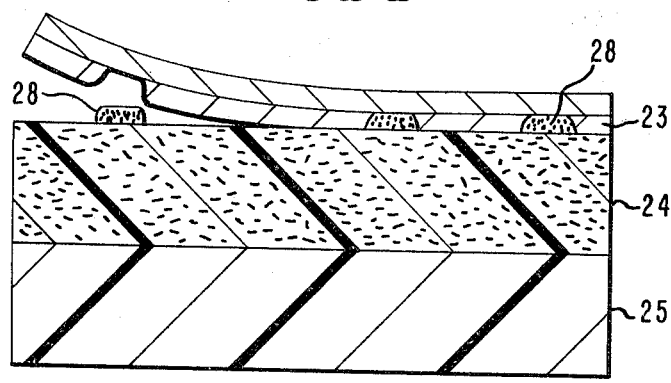
FIG. 3C represents removal of the unexposed portion.

FIG. 3C: Due to the thermally induced change in adhesion, these opaque areas 28 remain on the surface of the photosensitive layer 24 when the thermal absorption cover sheet 22 is peeled off with the nonexposed thermal release layer 23 still intact.

Figure 3D:
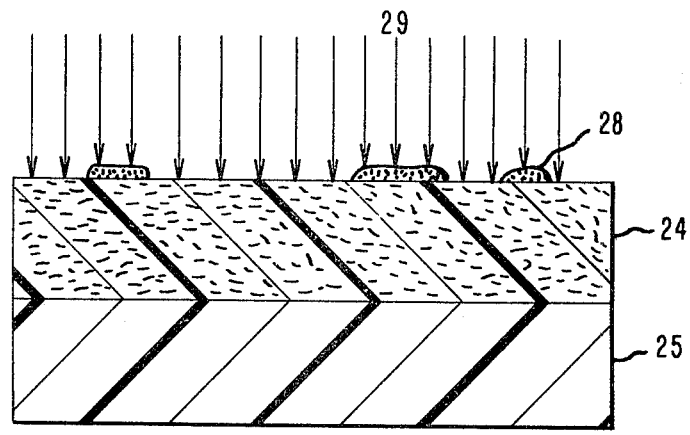
FIG. 3D represents exposure of the photomasked element.

FIG. 3D: An exposing radiation 29 reaches only the areas of the photosensitive layer 24 which are not protected by the photomask produced by the opaque areas 28.

Figure 3E:
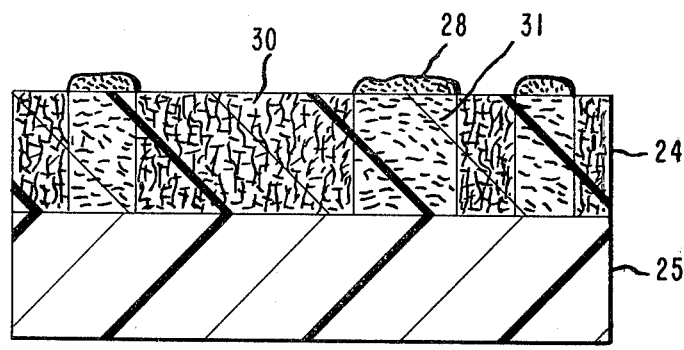
FIG. 3E represents photoreaction of the exposed portion.

FIG. 3E: By continued exposure or development process the exposed regions 30 are reacted in relation to unexposed regions 31 which were beneath the opaque regions 28.

Figure 3F:
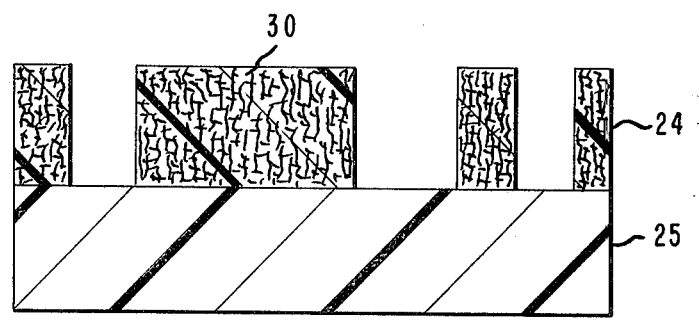
FIG. 3F represents removal of the unexposed portions.

FIG. 3F: By washing or fixing of the unexposed areas an image is produced which is a reversal of the original exposing radiation.

Figure 4A:
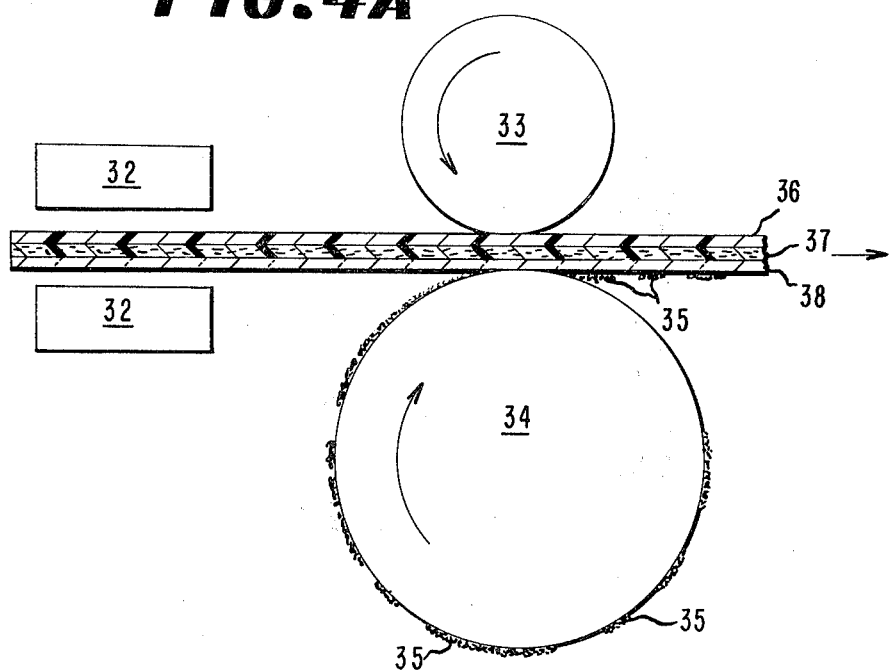
FIG. 4A represents a drum transfer device.

FIG. 4A: A photosensitive element comprising a support 36, a photosensitive layer 37, and a cover sheet 38 passes between heaters prior to passing between a pressure roll 33 and a drum transfer roll 34 having on its surface variable density toner 35 which transfers on contact to the cover sheet 35 which has been heated sufficiently to accept the toner 35.

Figure 4B:
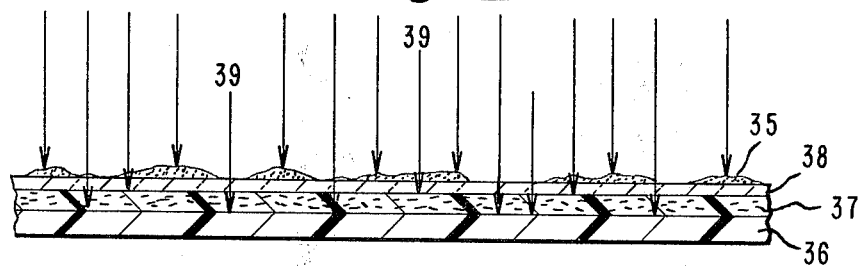
FIG. 4B represents exposure through a continuous tone photomask.

FIG. 4B: Radiation 39 produces variable eposure of the photosensitive layer 37 according to the density of the toner 35 on the cover sheet 38.

Figure 4C:
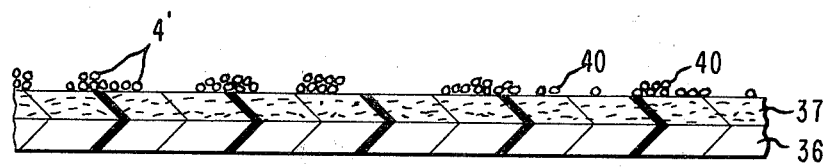
FIG. 4C represents variable density toning of the continuous toned image.

FIG. 4C: After the cover sheet has been removed toner 40 is applied to the surface which produces variable density in accord with the amount of exposure permitted by the photomask and thereby produces a negative continuous tone image.

Figure 4D:
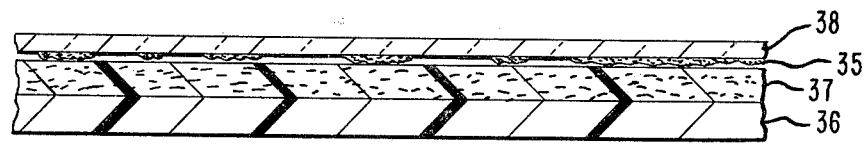
FIG. 4D represents inversion of a polished photomask.

FIG. 4D: The transferred tone 35 may be treated to give a finished surface and placed in direct contact with the photosensitive layer 37 in order to produce a sharper continuous tone image after exposure and toning.

Since it is well known in the art that photosensitive elements may be formulated for either direct or reversal imagings, there are many other possibilities not shown which could encompass the basic concept of the present invention by providing for the production of a radiation opaque photomask on the surface of a photosensitive element or some cover sheet or protective layer over such photosensitive element. It should be clear that the opaque photomask produced in situ can be removed with an outer layer, be incorporated into the final image, or be removed by some step in the processing of the image-bearing photosensitive layer.

The opaque image may be formed using, for example, magnetic toner, electrostatic toner, or photopolymer tack toner. Suitable photosensitive substrates include silver halide, photopolymer, photoplasticization, as well as vesicular, thermographic, and diazo systems or the like.

These photosensitive substrates show a differential response to light between imaged and nonimaged areas. In some the response is immediately visible, while in others a latent image is formed which must be converted to a visible image by a development or processing step. Dry room temperature peel apart photopolymer films represent a useful photosensitive element for the present invention since the image is produced by simply peeling off the cover sheet with the photomask. Areas of the photosensitive substrates not part of the final image must in some cases be removed by fixing or washing to make the image visible. Protective cover sheets are employed with photopolymer films which provide a convenient layer for receiving an opaque material such as toner particles, ink, or carbon black. Particularly useful are such commercial products as Riston® photoresist film, Dycril® printing plate, Cyrel® flexographic printing plate, Dylux® photosensitive paper, Cromalin® color proofing film, etc. The above are trademarks of the E. I. du Pont de Nemours and Company.

The following examples serve to illustrate the practice of the present invention, but are not intended to limit the concept of an in situ production of an imaging photomask.

EXAMPLE 1

Three types of artwork, continuous tone, line work, and halftone dots, were each transferred into magnetic images by being optically scanned and having the output signal from a photodetector used to modulate the recording field of a magnetic head in contact with a ferromagnetic coating of chromium dioxide. The magnetic recording element was comprised of a 11.4 microns thick chromium dioxide magnetic recording medium coated onto a transparent 0.18 mm polyethylene terephthalate film support. The line-to-line spacing was 50.8 microns and the magnetic head was 4.3 microns wide. For the continuous tone originals which were scanned the variable output from the photodetector was used to produce recording fields that varied as a function of the optical density of the original.

The line work images were scanned at 430 revolutions/cm while recording black image information at 390 cycles/cm and recording white image information at 8,200 cycles/cm.

Halftone images are of about 59 lines per cm (150 lines per inch) were made with the scanner operating at 670 revolutions/cm while recording with a square wave of 197 cycles/cm where black image information was being recorded and using 8,200 cycles/cm for white information.

The 8,200 cycles/cm wavelength is too short to produce magnetic signals on the chromium dioxide surface that will attract the magnetic toner particles used in image development.

The magnetic images were toned in magnetic toner baths, rinsed and air dried. High resolution images were obtained with two different toner baths.

---

Toner Bath #1
  2 g Fluorad ® FC 128[1]
  10 g Magnetic toner 8 particles
  Toner composition: Fe/Fe$_3$O$_4$ Versamid 930[4] 500 cc H$_2$O Toner Bath #2
  2 g Fluorad ® FC 128[1]
  10 g Magnetic toner 7 particles
  Toner composition: Fe$_3$O$_4$ Atlac 580E[3] 500 cc H$_2$O Rinse Bath
  2 g Fluorad ® FC 128[1]
  500 cc H$_2$O

---

[1]Fluorad FC 128 Purchased from 3M Co. A fluorocarbon dispersing agent.
[2]Versamid 930 Tradename of Henkel Adhesives. A polyamide aromatic adhesive.
[3]Atlac 580E Tradename of ICI, Ltd. A propoxylated bisphenol-A, fumaric acid polyester having a tack point of 70° C. and a liquid point of 100° C.

Because the amplitude of the recording signal varied, the amount of magnetic toner attracted to the image varied giving a toned image which had image densities that approximated the continuous tone original. For the line and halftone only the black image areas produced a toned image.

The toned magnetic images were mounted on the drum of a magnetic toner transfer machine (FIG. 4A).

Cromalin ® color proofing film manufactured according to U.S. Pat. No. 3,854,950 was thermally laminated to seven point Kromekote ®* paper, placed in the heater and heated to 128° C. The magnetic toner image was transferred to the Cromalin ® layer at 50 cm/sec. drum speed and a pressure of 7 kg per linear cm.
*Trademark of Champion International Co.

In the same manner magnetic toner was also transferred to a polyethylene terephthalate film heated to 128° C. in the heater.

The Cromalin ® laminates with toner images of line work, halftone, and continuous tone imaged on their surfaces were each placed in a Berkly vacuum frame which was evacuated for 30 sec. They were then exposed for 20 seconds (FIG. 4B).

The cover sheets were removed and the Cromalin ® laminates were toned with a mixture of two parts by weight cyan toner with one part white toner. Images of good quality were produced on the Cromalin ® surfaces. FIG. 4C is a representation of the variable toner density obtained for the continuous tone image reproduction.

The heated polyethylene terephthalate film with magnetic image was also used as a cover sheet material for Cromalin ® and used in a similar fashion as a photomask for imaging.

High quality, high resolution and products were produced with all the types of artwork and either with or without the use of a cover sheet.

EXAMPLE 2

To increase the sharpness of the Cromalin ® images produced in Example 1, the cover sheet of the Cromalin ® laminate containing the magnetic image of a continuous tone image on its surface was polished with Du Pont Slipspray lubricant. The polyethylene terephthalate cover sheet was removed from the Cromalin ® laminate and the magnetic image was placed with the polished toner image against the Cromalin ® polymer layer (FIG. 4D). This sample was exposed and toned as in Example 1 to produce a sharper image.

EXAMPLE 3

A photosensitive photopolymer resist layer was prepared according to U.S. Pat. No. 770,438 and coated on a polyethylene terephthalate cover sheet. This was laminated to a 0.004 cm thick copper clad sheet. An opaque image was printed on the cover sheet surface according to the teaching of copending application Ser. No. 124,605 of the Assignee filed Feb. 25, 1980.

The photopolymer layer was exposed by a DMVL-HP manufactured by Colight 2000 watt ultraviolet source for 60 seconds. The cover sheet was removed by peeling it off with the image adhering to it. The resist layer was immersed in methyl chloroform to remove the unexposed areas. The copper was etched in a 42° Baume solution of ferric chloride and hydrochloric acid to produce a printed circuit board. The process eliminated the normal phototool and vacuum contact exposure device but gave a high quality and high resolution end product.

EXAMPLE 4

A dry-developing room temperature peel apart resist film was prepared as described in Example 1 of Assignee's copending application Ser. No. 6,144,300 filed April 28, 1980. When an opaque image was created on the cover sheet surface as in either Example 1 or Example 3 of the present invention a visible photomask was produced. When the cover sheet was removed the image was simultaneously developed as the cover sheet was removed. Productivity is increased since the conventional steps of positioning the photomask and removing it after exposure have been eliminated.

EXAMPLE 5

Du Pont positive Cromalin ®[1] proofing film C4/CP was laminated to white bond paper. This paper was substituted for the ordinary white paper normally used in a Kodak Ektoprint ®[2] 100 Copier Duplicator. An electrostatic toned image was thus formed on the cover sheet over the photosensitive photopolymer layer laminated on the white bond paper. The electrostatic toned image on the cover sheet served as a photomask for a 30 unit exposure of the photopolymer film in a 2KW Berkey-Ascor vacuum printer. The cover sheet with the electrostatic photomask was removed and Cromalin ® magenta toner 50PM was applied to the photopolymer layer on the paper. The excess toner was removed. A negative image was obtained on the paper support. Similar results were also obtained with cyan and black toners.

(1) Trademark of E. I. du Pont de Nemours and Company, Wilmington, DE for color display films.
(2) Tradename of Eastman Kodak Co., Rochester, NY for electrostatic copying apparatus.

EXAMPLE 6

The procedure of Example 5 was repeated except that instead of white bond paper, a clear transparency film made for the Kodak Ektoprint ® by Imaging Products 12696 Rockhaven Road, Cleveland, Ohio 44026 was used. A 5 unit exposure was given prior to removing the cover sheet with the electrostatic toner photomask. Toning with a cyan toner and removing the excess toner produced a satisfactory transparency image.

Both the electrostatic image on the cover sheet and the toned photopolymer image on the transparent film provided useful transparent images.

We claim:

1. A process for photoimaging a photosensitive layer comprising the steps:
   (a) forming in situ an actinic radiation-opaque image on a transparent cover sheet which is on the photosensitive layer;
   (b) exposing the image-bearing layer to actinic radiation by which the layer is photoimaged;
   (c) removing the cover sheet; and
   (d) developing or fixing the photoimage.

2. The process of claim 1 in which the image is formed by transfer onto the cover sheet by
   (i) forming a latent image on a magnetic or electrostatic recording surface;
   (ii) toning the recording surface with opaque toner to form a toner image; and
   (iii) transferring the toned image to the cover sheet.

3. The process of claim 1 in which the photosensitive layer is supported on a polymeric film.

4. The process of claim 2 in which the latent image is derived from an electronic signal.

5. The process of claim 1 wherein the image is formed using magnetic toner.